United States Patent
Su et al.

(10) Patent No.: US 10,903,245 B2
(45) Date of Patent: Jan. 26, 2021

(54) PIXEL ARRAY SUBSTRATE

(71) Applicant: Au Optronics Corporation, Hsinchu (TW)

(72) Inventors: Chih-Chung Su, Kaohsiung (TW); Yi-Wei Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/596,677

(22) Filed: Oct. 8, 2019

(65) Prior Publication Data
US 2020/0343269 A1    Oct. 29, 2020

(30) Foreign Application Priority Data
Apr. 24, 2019 (TW) .............................. 108114319 A

(51) Int. Cl.
H01L 27/12 (2006.01)
(52) U.S. Cl.
CPC .................................. *H01L 27/124* (2013.01)
(58) Field of Classification Search
CPC ........... H01L 27/14609; H01L 27/3248; H01L 27/124
USPC ......................................................... 257/72
See application file for complete search history.

(56) References Cited

U.S. PATENT DOCUMENTS

| 9,869,914 B2 | 1/2018 | Huang et al. |
| 9,934,723 B2 | 4/2018 | Lee et al. |
| 10,211,270 B2 | 2/2019 | Ha |
| 2015/0355517 A1 | 12/2015 | Huang et al. |
| 2018/0151650 A1 | 5/2018 | Ha |

FOREIGN PATENT DOCUMENTS

| CN | 104062823 | 9/2014 |
| CN | 106537313 | 3/2017 |
| CN | 106684155 | 5/2017 |
| CN | 108122930 | 6/2018 |
| TW | I648722 | 1/2019 |

*Primary Examiner* — Elias Ullah
(74) *Attorney, Agent, or Firm* — JCIPRNET

(57) ABSTRACT

A pixel array substrate including a substrate, a plurality of pixel structures and a scan device is provided. The pixel structures are arranged on the substrate along a first direction. Each pixel structure includes a data line, an active device and a pixel electrode. The active device has a semiconductor pattern, a source electrode and a drain electrode. The source electrode and the drain electrode are electrically connected to the data line and the pixel electrode respectively. The scan device includes a first and a second scan line. The first and the second scan line extend in the first direction and are electrically connected to each other. The active devices of the pixel structures are electrically connected to the first and the second scan line. The first and the second scan line respectively overlap two different regions of the semiconductor pattern of each active device.

11 Claims, 3 Drawing Sheets

PIXEL ARRAY SUBSTRATE

CROSS-REFERENCE TO RELATED APPLICATION

This application claims the priority benefit of Taiwan application serial no. 108114319, filed on Apr. 24, 2019. The entirety of the above-mentioned patent application is hereby incorporated by reference herein and made a part of this specification.

BACKGROUND

Field of the Invention

The present invention relates to a semiconductor substrate, and particularly to a pixel array substrate.

Description of Related Art

The emergence of a retina display, in addition to bringing consumers an unprecedented visual experience, has led to the diversified development of head-mounted display technologies, such as virtual reality (VR), augmented reality (AR) and mixed reality (MR). In order to make the display effect of the above applications realistic, an ultrahigh resolution display panel is needed. However, as the resolution of the display panel continually increases, space for arranging a pixel structure decreases, and the size design of a pixel driving circuit challenges the limits of the manufacturing process of a production machine. Therefore, how to improve the resolution of the panel while maintaining mass productivity is a problem that many manufacturers are urgently trying to solve.

SUMMARY OF THE INVENTION

The present invention provides a pixel array substrate with high resolution.

The pixel array substrate of the present invention includes a substrate, a plurality of pixel structures and a scan device. The plurality of pixel structures are arranged on the substrate along a first direction. Each of the plurality of pixel structures includes a data line, an active device and a pixel electrode. The active device has a semiconductor pattern, a source electrode and a drain electrode. The source electrode and the drain electrode are electrically connected to the data line and the pixel electrode respectively. The scan device includes a first scan line and a second scan line. The first scan line and the second scan line extend in the first direction and are electrically connected to each other. The active devices of the plurality of pixel structures are electrically connected to the first scan line and the second scan line. The first scan line and the second scan line respectively overlap two different regions of the semiconductor pattern of each of the active devices.

In an embodiment of the present invention, the scan device of the pixel array substrate further includes a connecting portion, and the connecting portion is electrically connected between the first scan line and the second scan line.

In an embodiment of the present invention, the connecting portion of the pixel array substrate is disposed between any adjacent two of the semiconductor patterns of the plurality of pixel structures.

In an embodiment of the present invention, the connecting portion of the pixel array substrate overlaps one of the data lines of the plurality of pixel structures.

In an embodiment of the present invention, the first scan line and the second scan line of the pixel array substrate are located between the source electrode and the drain electrode of the active device.

In an embodiment of the present invention, the semiconductor pattern of the pixel array substrate has a first segment and a second segment. The first segment and the second segment respectively extend in the first direction and a direction perpendicular to the first direction. The first scan line and the second scan line respectively overlap two different regions of the second segment.

In an embodiment of the present invention, the pixel array substrate further includes a plurality of light shielding patterns separated from each other. Each of the plurality of light shielding patterns is disposed between the substrate and the semiconductor pattern of the active device of the corresponding pixel structure.

In an embodiment of the present invention, the pixel electrode of each of the plurality of pixel structures of the pixel array substrate overlaps one of the first scan line and the second scan line.

In an embodiment of the present invention, the drain electrode of the active device of each of the pixel structures of the pixel array substrate overlaps one of the first scan line and the second scan line.

In an embodiment of the present invention, the pixel array substrate further includes a planarization layer covering the source electrode and the drain electrode. The planarization layer has a first contact window overlapping the drain electrode. The first contact window overlaps one of the first scan line and the second scan line.

In an embodiment of the present invention, the pixel array substrate further includes an insulating layer covering the planarization layer and a portion of a surface of the drain electrode. The insulating layer has a second contact window overlapping the first contact window. The pixel electrode is electrically connected to the drain electrode through the first contact window and the second contact window.

Based on the above, in the pixel array substrate of the embodiment of the present invention, a plurality of pixel structures are arranged on extension paths of the first scan line and the second scan line, and the semiconductor pattern of each of the pixel structures overlaps the first scan line and the second scan line electrically connected to each other. Thereby, the configuration space required for the active device is reduced, and the process margin of a pixel circuit is increased. In another aspect, when the pixel size is further reduced, the active device can still maintain a double-gate configuration, which helps maintain good electrical properties.

In order to make the aforementioned and other features and advantages of the present invention comprehensible, embodiments accompanied with figures are described in detail below.

DESCRIPTION OF THE EMBODIMENTS

Figure 1:
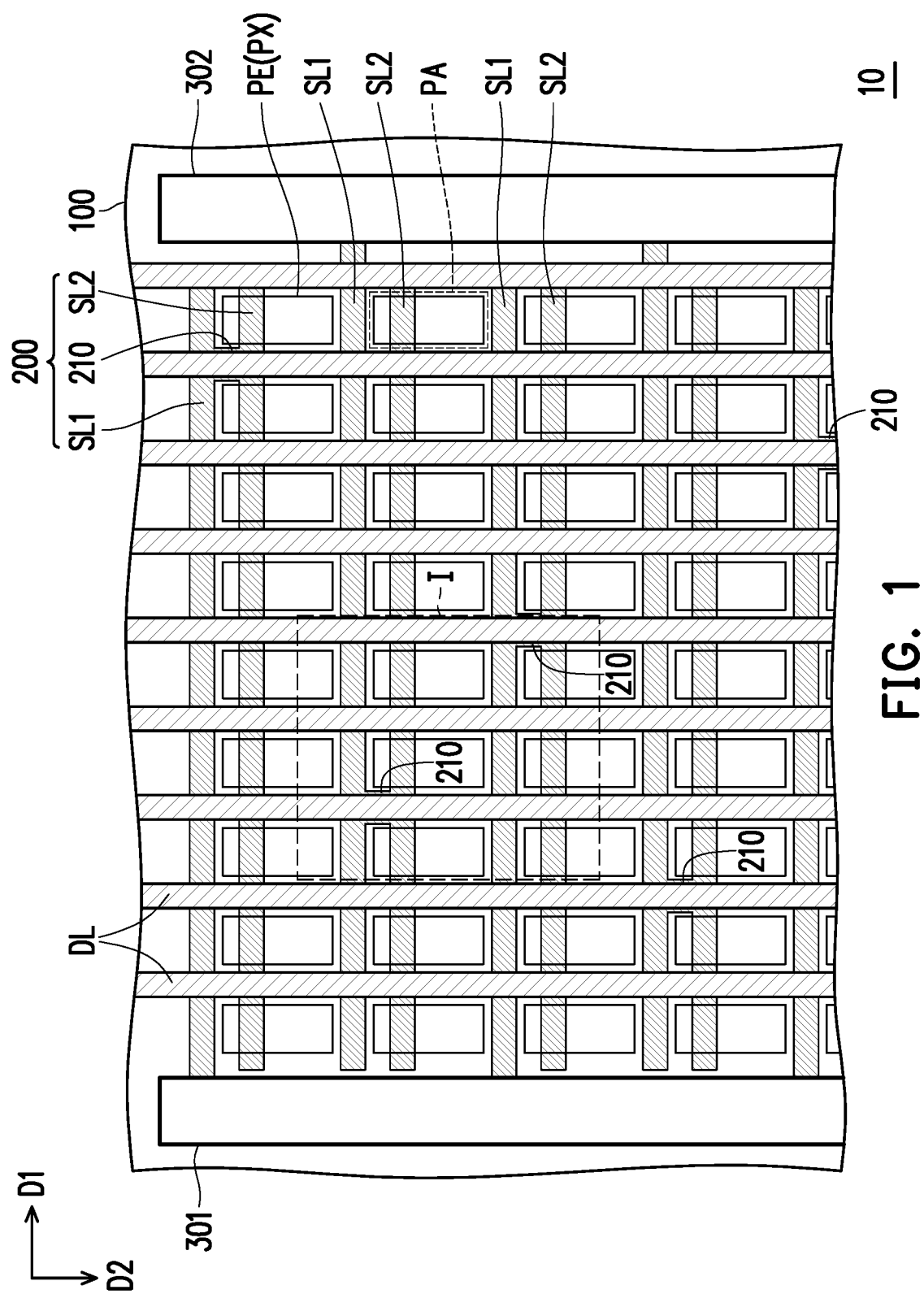
FIG. 1 is a schematic top view of a pixel array substrate according to an embodiment of the present invention.

As used herein, "about", "approximately", "essentially" or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", "essentially" or "substantially" may refer to a more acceptable range of deviation or a standard deviation depending on measurement properties, cutting properties, or other properties without applying one standard deviation to all properties.

In the accompanying drawings, the thicknesses of layers, films, panels, regions, and the like are enlarged for clarity. Throughout the specification, same reference numerals indicate same elements. It should be understood that when an element such as a layer, film, region or substrate is referred to as being "on" or "connected" to another element, it may be directly on or connected to the another element, or intervening elements may also be present. In contrast, when an element is referred to as being "directly on" or "directly connected to" another element, there are no intervening elements present. As used herein, "connection" may refer to a physical and/or electrical connection. Further, "electrical connection" may mean that other elements exist between two elements.

In addition, relative terms such as "below", "bottom", "on" or "top" are used in this specification to describe a relationship between one element and another element, as shown in the figures. It should be understood that such spatially relative terms are intended to encompass different orientations of the device in addition to the orientation depicted in the figures. For example, if a device in a figure is turned over, an element described as being "above" or "upper" relative to another element will then be "below" or "lower" relative to the other element. Thus, the term "below" encompasses both the below and above orientations. Similarly, if a device in a figure is turned over, an element described as being "below" or "lower" relative to another element will then be "above" or "upper" relative to the other element. Thus, the term "top" or "bottom" encompasses both the above and below orientations.

In the present invention, for ease of understanding, the positions of a source electrode and a drain electrode of a transistor are shown as examples in the drawings and are not intended to limit the present invention. This is because the source electrode and the drain electrode of the transistor will vary with the flow direction of current or depending on whether the transistor is an NMOS transistor or a PMOS transistor.

Reference will now be made in detail to the exemplary embodiments of the invention, examples of which are illustrated in the accompanying drawings. Wherever possible, the same reference numerals are used in the drawings and the description to refer to the same or like parts.

Figure 2:
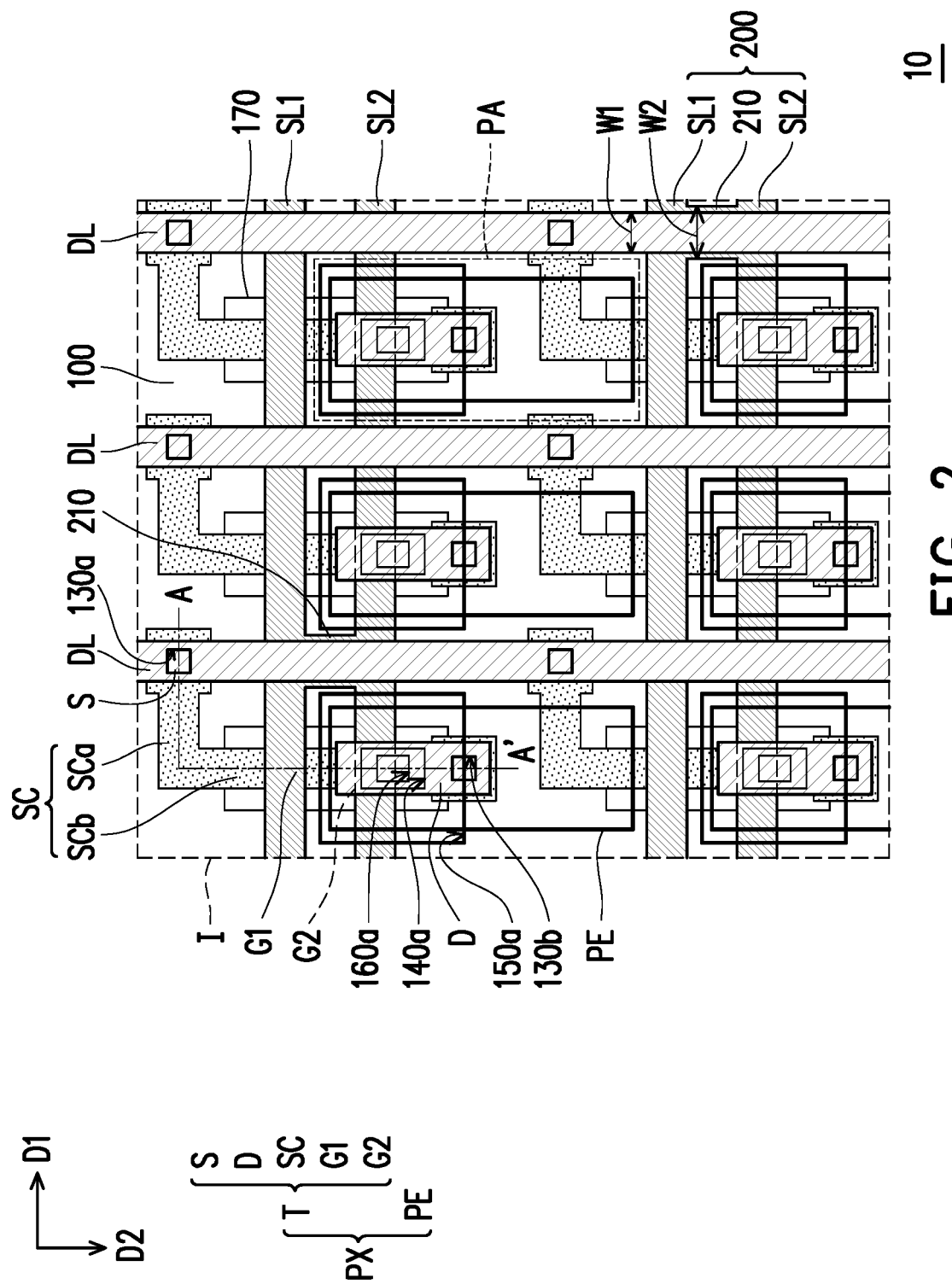
FIG. 2 is a schematic enlarged view of a partial region of the pixel array substrate of FIG. 1.
Figure 3:
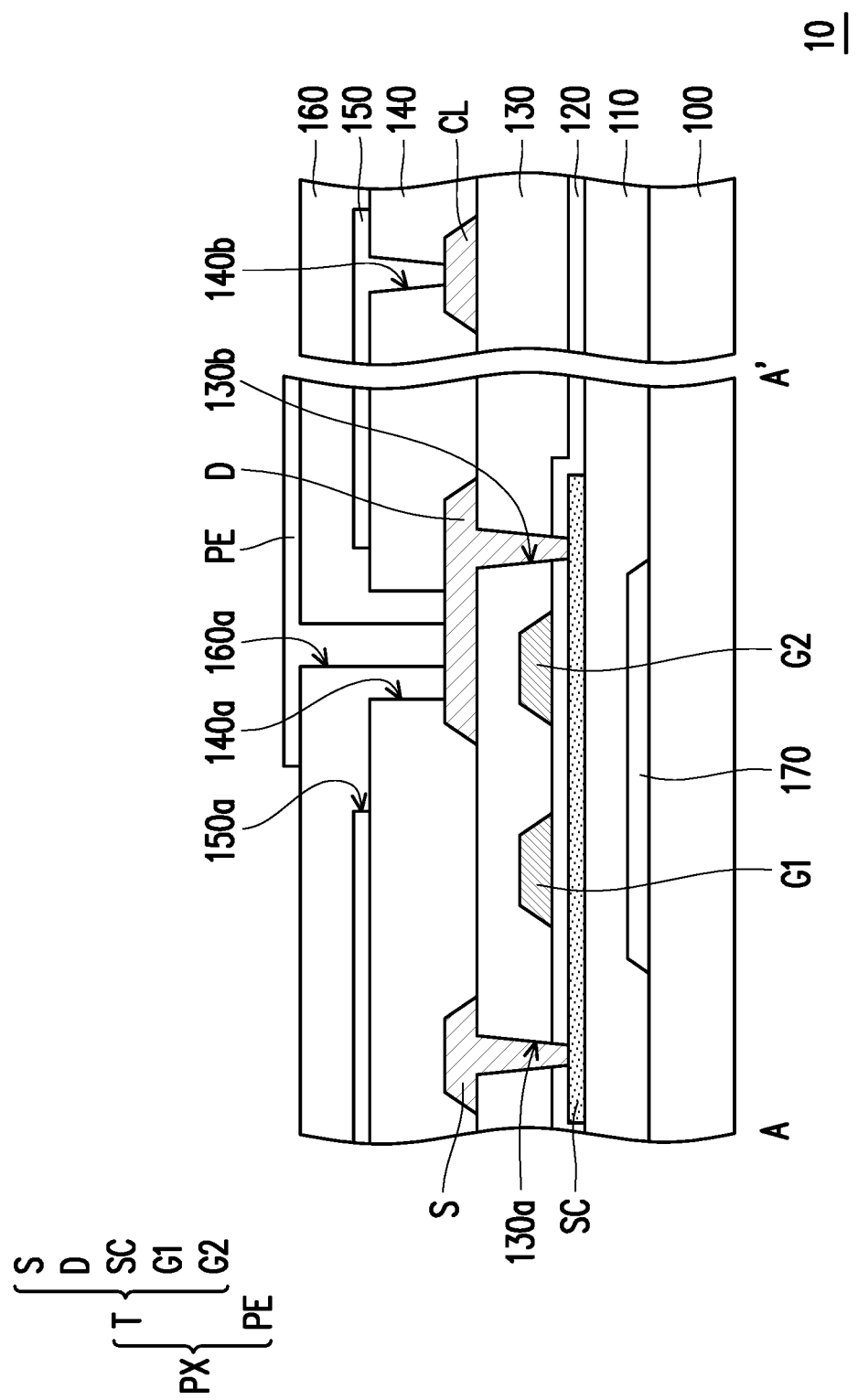
FIG. 3 is a schematic cross-sectional view of the pixel array substrate of FIG. 2.

FIG. 1 is a schematic top view of a pixel array substrate according to an embodiment of the present invention. FIG. 2 is a schematic enlarged view of a partial region of the pixel array substrate of FIG. 1. FIG. 3 is a schematic cross-sectional view of the pixel array substrate of FIG. 2. It is to be specially noted that FIG. 2 corresponds to a region I of FIG. 1, and FIG. 3 corresponds to a line A-A' of FIG. 2. For the sake of clarity, FIG. 1 only shows a first gate driving circuit 301 and a second gate driving circuit 302, as well as a substrate 100, data lines DL, a pixel electrode PE and a scan device 200 of FIG. 2, and FIG. 2 omits a buffer layer 110, a gate insulating layer 120, an interlayer insulating layer 130, a planarization layer 140, an insulating layer 160 and a common signal line CL of FIG. 3. In addition, FIG. 2 omits a plurality of slits of the pixel electrode PE overlapping a common electrode 150.

In particular, the pixel array substrate of the present invention may be applied to a display panel. The display panel further includes a display medium (for example, a liquid crystal material layer and a luminescent material layer) disposed on the pixel array substrate, and a driving electrode covering the display medium. For example, a pixel array substrate 10 of FIG. 1 to FIG. 3 may be applied to a non-self-luminous display panel, such as a liquid crystal display panel (LCD panel). However, in other embodiments, the pixel array substrate may also applied to a self-luminous display panel, such as an organic light emitting diode (OLED) panel, a micro light emitting diode (micro LED) panel, and a mini light emitting diode (mini LED) panel.

Referring to FIG. 1 and FIG. 2, the pixel array substrate 10 includes a substrate 100, a plurality of data lines DL and a plurality of pixel structures PX. The data lines DL are arranged on the substrate 100 along a first direction D1 and extend in a second direction D2. The pixel structures PX may be arranged on the substrate 100 in an array, and each pixel structure PX is disposed between two adjacent data lines DL. Further speaking, the pixel array substrate 10 further includes a plurality of scan devices 200. The scan devices 200 are arranged in a plurality of rows on the substrate 100 along the second direction D2. The scan device 200 includes a first scan line SL1 and a second scan line SL2 electrically connected to each other, and the first scan line SL1 and the second scan line SL2 extend in the first direction D1. For example, the pixel array substrate 10 may further optionally include a first gate driving circuit 301 and a second gate driving circuit 302. The scan devices 200 of an odd-numbered row are electrically connected to the first gate driving circuit 301, and the scan devices 200 of an even-numbered row are electrically connected to the second gate driving circuit 302, but the present invention is not limited thereto. In some embodiments, all of the scan devices 200 may be electrically connected to the same gate driving circuit. In particular, in the present embodiment, the first scan lines SL1 intersect the data lines DL to define a plurality of pixel areas PA, and the pixel structures PX are disposed respectively corresponding to the pixel areas PA.

In the present embodiment, the scan device 200 may optionally include a connecting portion 210, and the connecting portion 210 is electrically connected between the first scan line SL1 and the second scan line SL2. For example, the materials of the connecting portion 210, the first scan line SL1 and the second scan line SL2 may optionally be the same. That is, the connecting portion 210, the first scan line SL1 and the second scan line SL2 may be formed in the same layer. However, the invention is not limited thereto. According to other embodiments, the connecting portion 210 and the first scan line SL1 (or the second scan line SL2) may be formed in different layers, and the first scan line SL1 and the second scan line SL2 may be electrically connected to each other through the bridging of the connecting portion 210.

In particular, in order not to occupy excessive circuit layout space, the connecting portion 210 may optionally overlap one of the data lines DL in the normal direction of the substrate 100, but the present invention is not limited thereto. In the present embodiment, the data lines DL and the connecting portion 210 respectively have a first width W1 and a second width W2 in the first direction D1, and the first width W1 is optionally less than the second width W2. However, the present invention is not limited thereto. According to another embodiment, the first width W1 of the data lines DL and the second width W2 of the connecting portion 210 may be substantially equal. According to still another embodiment, the first width W1 of the data lines DL may be optionally greater than the second width W2 of the connecting portion 210. It should be noted that, in the present embodiment, the number of the connecting portion 210 of each scan device 200 is exemplarily described as one, and the present invention is not limited to the disclosed contents of the drawings. In some embodiments, the number of the connecting portions 210 of each scan device 200 can be adjusted according to actual demands.

In the present embodiment, the materials of the data line DL and the scan device 200 are generally metal materials in view of conductivity. However, the present invention is not limited thereto. According to other embodiments, the data line DL and the scan device 200 may use other conductive materials, for example, an alloy, a nitride of a metal material, an oxide of a metal material, an oxynitride of a metal material, or other suitable materials, or a stack layer of metal materials and other conductive materials.

Referring to FIG. 2, the pixel structure PX includes an active device T and a pixel electrode PE electrically connected to the active device T. In detail, the active device T has a source electrode S, a drain electrode D, a first gate electrode G1, a second gate electrode G2 and a semiconductor pattern SC, where the source electrode S is electrically connected to the data line DL, the drain electrode D is electrically connected to the pixel electrode PE, and the semiconductor pattern SC is electrically connected between the source electrode S and the drain electrode D. For example, in the normal direction of the substrate 100, the pixel electrode PE may optionally overlap the second scan line SL2, but the present invention is not limited thereto. In the present embodiment, the pixel electrode PE may be a light transmissive electrode, and the material of the transmissive electrode includes a metal oxide such as indium tin oxide, indium zinc oxide, aluminum tin oxide, aluminum zinc oxide, or other suitable oxide, or a stack layer of at least two of the above. However, the present invention is not limited thereto. In some embodiments, the pixel electrode PE may be a reflective electrode, and the reflective electrode includes a metal, an alloy, a nitride of a metal material, an oxide of a metal material, an oxynitride of a metal material, or other suitable material, or a stack layer of metal materials and other conductive materials.

In particular, two vertical projections of the first scan line SL1 and the second scan line SL2 of the scan device 200 on the substrate 100 may be located between two vertical projections of the source electrode S and the drain electrode D of the corresponding active device T on the substrate 100, so that the number of bends of the semiconductor pattern SC may be reduced. In other words, the complexity of the pattern of a semiconductor layer may be reduced, which helps increase the design margin of a pixel circuit and improve its manufacturing yield. In the present embodiment, the semiconductor pattern SC of the active device T may overlap a portion of the data line DL, and more specifically, a portion of the data line DL overlapping the semiconductor pattern SC in the normal direction of the substrate 100 may optionally be used as the source electrode S of the active device T, but the present invention is not limited thereto. In another aspect, in the normal direction of the substrate 100, the drain electrode D of the active device T may optionally overlap the second scan line SL2.

Further, in the present embodiment, the semiconductor pattern SC may optionally include a first segment SCa and a second segment SCb, and an extension direction of the first segment SCa intersects an extension direction of the second segment SCb. For example, the extension direction of the first segment SCa may be substantially parallel to an extension direction (i.e., the first direction D1) of the first scan line SL1 and the second scan line SL2, and the extension direction of the second segment SCb may be substantially parallel to an extension direction (i.e., the second direction D2) of the data line DL. However, the present invention is not limited thereto. In some embodiments, the semiconductor pattern SC may have only the second segment SCb extending in the second direction D2, and the source electrode S of the active device T may be formed by a projecting portion of the data line DL extending out toward one side of the semiconductor pattern SC and overlapping the second segment SCb.

In another aspect, the active devices T of the pixel structures PX arranged along the first direction D1 are electrically connected to the first scan line SL1 and the second scan line SL2, and in the normal direction of the substrate 100, the first scan line SL1 and the second scan line SL2 respectively overlap two different regions of the semiconductor pattern SC of each active device T. In the present embodiment, the semiconductor patterns SC of the active devices T arranged in the first direction D1 are all located on extension paths of the first scan line SL1 and the second scan line SL2 of the corresponding scan device 200. Therefore, two portions of the first scan line SL1 and the second scan line SL2 overlapping the semiconductor pattern SC may be respectively used as the first gate electrode G1 and the second gate electrode G2 corresponding to the semiconductor pattern SC. Thereby, the configuration space required for the active device can be reduced, and the process latitude can be increased, and when the size of the active device is further reduced, the double-gate configuration can still be maintained, thereby maintaining the operational electrical properties of the active device.

Further speaking, since an extension length of the second segment SCb of the semiconductor pattern SC in the second direction D2 is significantly greater than an extension length of the first segment SCa in the first direction D1, that is, the semiconductor pattern SC can be substantially in an I shape, such that the first scan line SL1 and the second scan line SL2 extending in the first direction D1 respectively overlap the two different regions of the second segment SCb, which helps improve the design margin of the pixel circuit.

Referring to FIG. 3, in the present embodiment, the first gate electrode G1 and the second gate electrode G2 of the active device T are optionally disposed above the semiconductor pattern SC, that is, the active device T is a top-gate thin film transistor (top-gate TFT). However, the present invention is not limited thereto. In other embodiments, the first gate electrode G1 and the second gate electrode G2 of the active device T may be disposed below the semiconductor pattern SC, that is, the active device T may be a bottom-gate thin film transistor (bottom-gate TFT).

For example, in the present embodiment, a method of forming the active device T may include the following step:

the buffer layer 110, the semiconductor pattern SC, the gate insulating layer 120, the first gate electrode G1, the second gate electrode G2, the interlayer insulating layer 130, the source electrode S and the drain electrode D are sequentially formed on the substrate 100, where the source electrode S is electrically connected to the semiconductor pattern SC through a contact window 130a formed in the gate insulating layer 120 and the interlayer insulating layer 130, and the drain electrode D is electrically connected to the semiconductor pattern SC through a contact window 130b formed in the gate insulating layer 120 and the interlayer insulating layer 130, but the present invention is not limited thereto.

In the present embodiment, the semiconductor pattern SC, the buffer layer 110, the gate insulating layer 120, the first gate electrode G1, the second gate electrode G2, the interlayer insulating layer 130, the source electrode S and the drain electrode D may be achieved respectively by any semiconductor pattern, any gate insulating layer, any gate electrode, any interlayer insulating layer, any source electrode and any drain electrode used for a pixel array substrate and known to those of ordinary skill in the art, and the semiconductor pattern SC, the buffer layer 110, the gate insulating layer 120, the first gate electrode G1, the second gate electrode G2, the interlayer insulating layer 130, the source electrode S and the drain electrode D may be formed respectively by any method known to those of ordinary skill in the art. In addition, in the present embodiment, the active device T may be a low temperature poly-silicon thin film transistor (LTPS TFT). However, the present invention is not limited thereto. In other embodiments, the active device T may be an amorphous silicon TFT (a-Si TFT), a microcrystalline silicon thin film transistor (micro-Si TFT) or a metal oxide transistor.

Further, the pixel array substrate 10 may optionally include the planarization layer 140 and the common electrode 150. The planarization layer 140 covers the source electrode S and the drain electrode D. In the normal direction of the substrate 100, the planarization layer 140 has a contact window 140a overlapping the drain electrode D, and the contact window 140a of the planarization layer 140 may overlap the second gate electrode G2. The common electrode 150 covers the planarization layer 140 and has an opening 150a overlapping the contact window 140a. In the present embodiment, the pixel array substrate 10 may optionally include the common signal line CL. The common electrode 150 is electrically connected to the common signal line CL through the contact window 140b of the planarization layer 140. In another aspect, in the normal direction of the substrate 100, the contact window 140a of the planarization layer 140 may optionally overlap the second scan line SL2.

For example, the materials of the common signal line CL, the source electrode S and the drain electrode D may optionally be the same. That is, the common signal line CL, the source electrode S and the drain electrode D may be formed in the same layer, but the present invention is not limited thereto. In the present embodiment, the material of the planarization layer 140 is, for example, an organic insulating material. The organic insulating material may include polyimide, polyester, benzocyclobutene (BCB), polymethylmethacrylate (PMMA), poly(4-vinylphenol) (PVP), polyvinyl alcohol (PVA), polytetrafluoroethene (PTFE), hexamethyldisiloxane (HMDSO), or other suitable organic insulating materials.

In another aspect, the pixel array substrate 10 may further include the insulating layer 160. The pixel electrode PE is disposed on the insulating layer 160. The insulating layer 160 covers a portion of a surface of the common electrode 150 and the planarization layer 140, and fills the contact window 140a of the planarization layer 140 to cover a portion of a surface of the drain electrode D. In the normal direction of the substrate 100, the insulating layer 160 has a contact window 160a overlapping the contact window 140a and the drain electrode D, and the pixel electrode PE fills the contact window 160a to be electrically connected to the drain electrode D of the active device T. In the present embodiment, the material of the insulating layer 160 may include an inorganic material (for example, silicon oxide, silicon nitride, silicon oxynitride, other suitable materials, or a stack layer of at least two of the above materials), an organic material or other suitable materials, or a combination of the above.

Referring to FIG. 2 and FIG. 3, in the present embodiment, the pixel array substrate 10 may further optionally include a plurality of light shielding patterns 170 respectively. The light shielding patterns 170 respectively correspond to the pixel structures PX and are separated from each other in structure. Specifically, each of the light shielding patterns 170 is disposed between the substrate 100 and the semiconductor pattern SC of the active device T of the corresponding pixel structure PX. Thus, it is possible to prevent regions (i.e., channel regions) of the semiconductor pattern SC overlapping the first gate electrode G1 and the second gate electrode G2 from degradation under the long-time illumination of backlight, thereby improving the reliability of the active device. For example, since the second segment SCb of the semiconductor pattern SC overlapping the first scan line SL1 and the second scan line SL2 in the normal direction of the substrate 100 may extend in an extension direction (i.e., the second direction D2) parallel to the data line DL, the light shielding patterns 170 may be disposed on the substrate 100 along the extension path of the second segment SCb (as shown in FIG. 2). Thus, when the pixel size is further reduced, it can still be ensured that any two adjacent light shielding patterns 170 are electrically isolated from each other, which helps reduce the risk of electrical cross-talk of the pixels and increases the process latitude of the pixel circuit.

Based on the above, in the pixel array substrate of an embodiment of the present invention, the pixel structures are arranged on the extension paths of the first scan line and the second scan line, and the semiconductor pattern of each pixel structure overlaps the first scan line and the second scan line electrically connected to each other. Thereby, the configuration space required for the active device is reduced, and the process margin of the pixel circuit is increased. In another aspect, when the pixel size is further reduced, the active device can still maintain a double-gate configuration, which helps maintain good electrical properties.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:
1. A pixel array substrate, comprising:
  a substrate;
  a plurality of pixel structures, arranged on the substrate along a first direction, each of the plurality of pixel structures comprising a data line, an active device and a pixel electrode, and the active device comprising a semiconductor pattern, a source electrode and a drain electrode, wherein the source electrode and the drain electrode are electrically connected to the data line and the pixel electrode respectively; and a scan device, comprising:

a first scan line and a second scan line, extending in the first direction and being electrically connected to each other, wherein the active devices of the plurality of pixel structures are electrically connected to the first scan line and the second scan line, and the first scan line and the second scan line respectively overlap two different regions of the semiconductor pattern of each of the active devices.

2. The pixel array substrate according to claim 1, wherein the scan device further comprises a connecting portion, and the connecting portion is electrically connected between the first scan line and the second scan line.

3. The pixel array substrate according to claim 2, wherein the connecting portion is disposed between any adjacent two of the semiconductor patterns of the plurality of pixel structures.

4. The pixel array substrate according to claim 2, wherein the connecting portion overlaps one of the data lines of the plurality of pixel structures.

5. The pixel array substrate according to claim 1, wherein the first scan line and the second scan line are located between the source electrode and the drain electrode of the active device.

6. The pixel array substrate according to claim 1, wherein the semiconductor pattern comprises a first segment and a second segment, the first segment and the second segment respectively extending in the first direction and a direction perpendicular to the first direction, wherein the first scan line and the second scan line respectively overlap two different regions of the second segment.

7. The pixel array substrate according to claim 1, further comprising a plurality of light shielding patterns separated from each other, each of the plurality of light shielding patterns being disposed between the substrate and the semiconductor pattern of the active device of the corresponding pixel structure.

8. The pixel array substrate according to claim 1, wherein the pixel electrode of each of the plurality of pixel structures overlaps one of the first scan line and the second scan line.

9. The pixel array substrate according to claim 1, wherein the drain electrode of the active device of each of the plurality of pixel structures overlaps one of the first scan line and the second scan line.

10. The pixel array substrate according to claim 1, further comprising a planarization layer covering the source electrode and the drain electrode, the planarization layer comprising a first contact window overlapping the drain electrode, wherein the first contact window overlaps one of the first scan line and the second scan line.

11. The pixel array substrate according to claim 10, further comprising an insulating layer, the insulating layer covering the planarization layer and a portion of a surface of the drain electrode, and comprising a second contact window overlapping the first contact window, wherein the pixel electrode is electrically connected to the drain electrode through the first contact window and the second contact window.

* * * * *